(12) United States Patent
Farrell et al.

(10) Patent No.: US 7,680,167 B2
(45) Date of Patent: Mar. 16, 2010

(54) METHOD AND SYSTEM FOR DETECTION OF REGIONS OF INSTABILITY IN MULTI-SECTION TUNABLE LASERS

(75) Inventors: Thomas Farrell, Dublin (IE); Edmund Mowse, Ipswich (GB)

(73) Assignee: Intune Technologies Limited, Dublin (IE)

( * ) Notice: Subject to any disclaimer, the term of this patent is extended or adjusted under 35 U.S.C. 154(b) by 977 days.

(21) Appl. No.: 10/526,286

(22) PCT Filed: Aug. 29, 2003

(86) PCT No.: PCT/IE03/00115

§ 371 (c)(1),
(2), (4) Date: Jan. 6, 2006

(87) PCT Pub. No.: WO2004/021533

PCT Pub. Date: Mar. 11, 2004

(65) Prior Publication Data

US 2006/0114953 A1 Jun. 1, 2006

(30) Foreign Application Priority Data

Sep. 2, 2002 (IE) ............................... S2002/0710

(51) Int. Cl.
*H01S 3/00* (2006.01)

(52) U.S. Cl. ............... 372/38.07; 372/38.01; 372/38.02

(58) Field of Classification Search ................ 372/38.1, 372/38.01–38.09
See application file for complete search history.

(56) References Cited

U.S. PATENT DOCUMENTS 4,835,779 A * 5/1989 Liou ........................... 372/26
6,658,033 B1 * 12/2003 Andersson ............... 372/38.02

FOREIGN PATENT DOCUMENTS

WO     WO 00/49692      8/2000
WO     PCT/IB00/01476   * 10/2000

* cited by examiner

*Primary Examiner*—Minsun Harvey
*Assistant Examiner*—Xnning Niu
(74) *Attorney, Agent, or Firm*—McDonnell Boehnen Hulbert & Berghoff LLP

(57) ABSTRACT

This invention relates to a method and system to detect hysteresis/unstable regions of multi-section lasers. The method comprises the steps of obtaining a first set of measurement values for the output of the laser diode by increasing a first current through a range of values in a positive direction, increasing a second control current by a step, obtaining a second set of measurement values for the output of the laser diode by decreasing the first control current through a range of values in a negative direction, and increasing a second control current by a step. The process is repeated until a sufficient range of the second control currents has been used to provide resultant data which can then be processed in order to identify regions of hysteresis of the laser diode.

22 Claims, 4 Drawing Sheets

METHOD AND SYSTEM FOR DETECTION OF REGIONS OF INSTABILITY IN MULTI-SECTION TUNABLE LASERS

FIELD OF THE INVENTION

This invention relates to tunable lasers and the requirement to locate operating points of the tunable laser so that the output of the laser can be switched between different wavelengths. This invention specifically relates to a method and system to detect hysteresis/unstable regions of laser. Hysteresis in a laser means that the present state of a parameter of the laser such as power Side Mode Suppression Ratio (SMSR) is dependent on the previous state of the laser. These regions should be avoided when selected operating points of the laser.

BACKGROUND TO THE INVENTION

Multi section laser diodes are well known in the art and can be switched between different wavelengths. Typically the diode is calibrated at manufacture to determine the correct control currents that should be applied in each section of the laser so as to effect the desired output frequencies from the laser.

One of the first known multi-section laser diodes is a three-section tuneable distributed Bragg reflector (DBR) laser. Other types of multi-section diode lasers are the sampled grating DBR (SG-DBR), the superstructure sampled DBR (SSG-DBR) and the grating assisted coupler with rear sampled or superstructure grating reflector (GCSR). A review of such lasers is given in Jens Buus, Markus Christian Amann, *"Tuneable Laser Diodes"* Artect House, 1998 and *"Widely Tuneable Semiconductor Lasers"* ECOC'00. Beck Mason.

FIG. 1 is a schematic drawing of a DBR 10. The laser comprises of a Bragg reflector section 2 with a gain or active section 6 and phase section 4. An anti-reflection coating 9 is sometimes provided on the front and/or rear facets of the chip to avoid facet modes. The Bragg reflector takes the form of Bragg gratings 5. The pitch of the gratings of the Bragg reflector varies slightly to provide a Bragg mode which moves in frequency through varying the current supplied to these sections. The optical path length of the cavity can also be tuned with the phase section, for example by refractive index changes induced by varying the carrier density in this section. A more detailed description of the DBR and other tuneable multi-section diode lasers can be found elsewhere, for example in the publication by Jens Buus, Markus Christian Amann, entitled *"Tuneable Laser Diodes"* Artect House, 1998.

As detailed above, such tunable semiconductor lasers contain sections where current is injected to control the output wavelength/frequency, mode purity and power characteristics of the device. Various applications in telecommunications and sensor fields require that the laser can operate at points in a predetermined frequency/wavelength grid. Moreover, many applications require the power output of the device to be within a defined tolerance for each operating point, and in general, the operating points must be distanced from mode jumps and have high side-mode suppression. In order to provide lasers for such applications, each individual device must be characterised to the desired specification, so there is a corresponding need for a system or algorithm to map the output of the laser over a range of operating currents. It will be appreciated that for characterisation of lasers in production environments, such a system should also be fast, reliable and automated.

Certain types of tunable lasers present a characteristic where in certain conditions the output wavelength and power of the laser is dependent on the previous state of the laser. This characteristic is known as hysteresis. If an operating point of the laser is selected in a region where the laser has this characteristic, the output of the laser will be indeterminate and cannot be guaranteed, as it will be dependent on the previous operating point of the laser. It is known to provide applications that identify regions of instability in a laser, so as to ensure that the laser does not operate in these regions. One such application is disclosed in International Patent publication No. WO00/49692 entitled "A method of Evaluating Tuneable Lasers". This publication discloses a method wherein a reflector section of a laser is injected with varying current, while different constant currents are injected into the remaining tuneable sections of the laser. The method requires that for each set of different constant currents injected into the remaining sections of the laser, the current in the reflector section should be first swept in one direction, and then in the opposite direction back to the start value of the reflector current, while at the same time the power output of the laser device is measured and stored. The difference between the power measured for the same value of reflector current in the two opposite directions is then calculated and stored. Every combination of different constant currents injected into the remaining sections of the laser which results in no power difference between directions for a certain value of reflector current is considered to be a hysteresis-free combination, and is stored. This publication therefore provides a method which enables a laser to be controlled to transmit a certain wavelengths that will not cause the laser to operate in its unstable hysteresis region.

The method disclosed in the above International patent publication detects the regions of instability of a laser solely by means of measuring the optical power or wavelength of the laser. However a problem arises where the power difference is relatively small, as it can be difficult to detect small changes in the power of a laser.

As part of this invention other means of detecting regions of instability are noted, such as side mode suppression of a laser or gain section voltage.

Another problem associated with the above invention is that it requires large changes in current to be made while making measurements. One such significant current change occurs each time the currents injected into the sections of the laser are incremented, so as to provide a new combination of injected different constant currents for which a set of power measurements can be obtained, as during the time these injected currents are being incremented, the reflector current must be adjusted to zero. As the electrical power entering a laser is turned into heat in the passive sections of the laser, it will be appreciated that it is undesirable that this method requires such a large reflector current change, as these large current changes will result in a change of laser temperature.

The above-identified publication additionally requires that all the power measurements are performed while the reflector current is increasing. However, as explained above, an increase in reflector current results in an increase in the temperature of the laser. As the output characteristics of the laser are temperature dependent, it would be advantageous if the laser temperature could be kept constant while performing the measurements.

OBJECT OF THE INVENTION

The object of the present invention is to provide an improved method and system for locating hysteresis regions of a multi-section tunable laser. Another object of the present invention is to provide means of detecting regions of instability in a laser.

SUMMARY OF THE INVENTION

Accordingly, the present invention provides a method and system as laid out in the appended claims adapted to identify hysteresis regions of tunable laser so as to enable characterisation of the device to avoid these regions. By identification of the hysteresis regions, the operating points of the laser picked by a calibration will not exhibit this effect and will be independent of the previous state of the laser.

Accordingly the present invention provides a method and system for detecting hysteresis in a multi-section tunable laser diode. The methodology and technique is generic and can be applied to several different types of tunable laser such as DBR, SG-DBR, GCSR etc.

According to one aspect of the present invention, a method of obtaining the hysteresis regions of a laser is provided, the method comprising the steps of:
  obtaining a first set of measurement values for the output of the laser diode by increasing a first control current through a range of values in a positive direction;
  increasing a second control current by a step;
  obtaining a second set of measurement values for the output of the laser diode by decreasing the first control current through a range of values in a negative direction;
  increasing a second control current by a step;
  repeating the above steps until a sufficient range of the second control current has been used; and
  identifying in the resultant data set regions of hysteresis.

An advantage of the present invention over the prior art is that for this invention no measurement is made of the exact same currents in the laser twice. In the prior art the same currents in the laser must be measured twice as the laser current is ramped in two different directions. With the present invention no two measurements are made of the same current in the device, another current is changed in each direction and the post processing is performed in a two dimensional fashion.

Preferably, the identification of regions of hysteresis is effected by:
  applying to the resultant data a laplacian or similar operator; and
  thresholding the resultant data to obtain the hysteresis regions, the hysteresis regions being those regions where the value at a specified current is above the threshold value.

The post processing method in order to obtain the hysteresis from the measured data set method of the present invention is more tolerant to the noise of the laser than the prior art methods. This is due to the fact that the hysteresis is measured by comparison of two different operating points of the laser rather than the same operating point from two different directions.

The first and second sets of measurement values are obtained by transmitting the output of the laser diode to a photo diode, whereby an output of the photo diode provides the first and second measurement values.

Alternatively, the first and second set of measurement values are obtained by transmitting the output of the laser to a photo diode via an optical filter, whereby an output of the photo diode provides the measurement values.

Ideally, by using a suitable wavelength filter this measurement is therefore not just dependent on detection of regions of optical instability on the basis of optical power only.

Alternatively, the regions of hysteresis may be determined by using an erosion operator to obtain the hysteresis regions of the laser diode.

Preferably, the value of the increment of the first and second control currents is such that there are no large changes in any single control current between measurements.

As the overall current changes in the laser are continuous, this method reduces the thermal effects of a laser when compared to prior art methods.

In a further aspect of the invention, the invention provides a method of obtaining a measurement plane from a multi-section tunable laser, the method comprising the steps of:
  obtaining a first set of measurement values for the output of the laser diode by increasing a first control current through a range of values in a positive direction and decreasing a second control current in a negative direction at the same time;
  increasing one of the first or second control current by a step;
  obtaining a second set of measurement values for the output of the laser diode by increasing the second control current through a range of values in a positive direction and decreasing a first control current in a negative direction at the same time;
  repeating the above steps until a sufficient range of the first and the second control current has been used, where the total control currents to the laser are changing at a continuous rate.

According to yet another aspect of the invention, a control system is provided for obtaining a measurement plane from a multi-section tunable laser diode, the system comprising:
  means for obtaining a first set of measurement values for the output of the laser diode by increasing a first current through a range of values in a positive direction;
  means for increasing a second control current by a step;
  means for obtaining a second set of measurement values for the output of the laser diode by decreasing the first control current through a range of values in a negative direction;
  means for increasing a second control current by a step;
  means for repeating the above steps until a sufficient range of the second control current has been used; and
  means for identifying in the resultant data set regions of hysteresis.

Preferably, the means for identifying regions of hysteresis comprises:
  means for applying to the resultant data a laplacian or similar operator; and
  means for thresholding the resultant data to obtain the hysteresis regions, the hysteresis regions being those regions where the value at a specified current is above the threshold value.

The first and second sets of measurement values are obtained by transmitting the output of the laser diode to a photo diode, whereby an output of the photo diode provides the first and second measurement values.

Alternatively, the first and second set of measurement values are obtained by transmitting the output of the laser to a photo diode via an optical filter, whereby an output of the photo diode provides the measurement values.

Alternatively, the regions of hysteresis may be determined by using an erosion operator to obtain the hysteresis regions of the laser diode.

Preferably, the value of the increment of the first and second control currents is such that there are no large changes in any single control current between measurements thereby minimising the temperature effect contribution to the output of the laser.

According to yet another aspect of the present invention, a control system for obtaining a measurement plane from a multi-section tunable laser is provided, the system comprising:

means for obtaining a first set of measurement values for the output of the laser diode by increasing a first control current through a range of values in a positive direction and decreasing a second control current in a negative direction at the same time;

means for increasing one of the first or second control current by a step;

means for obtaining a second set of measurement values for the output of the laser diode by increasing the second control current through a range of values in a positive direction and decreasing a first control current in a negative direction at the same time; and means for repeating the above steps until a sufficient range of the first and the second control current has been used, where the total control currents to the laser are changing at a continuous rate.

There is also provided a computer program comprising program instructions for causing a computer program to carry out the above method which may be embodied on a record medium, carrier signal or read-only memory.

These and other features of the present invention will better understood with reference to the following drawings.

DETAILED DESCRIPTION OF THE DRAWINGS

The invention will now be described with reference to accompanying FIGS. 1 to 8.

Figure 6:
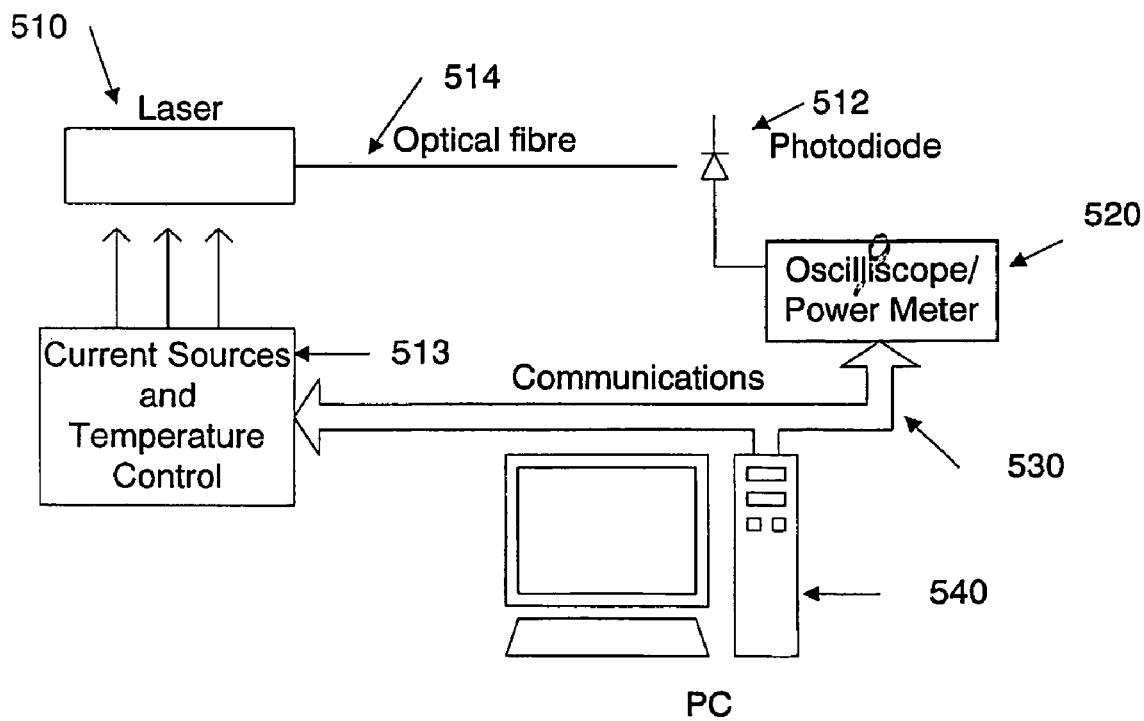
FIG. 6 shows an embodiment of the components used to perform the measurement of regions of instability in tunable lasers.
Figure 7:
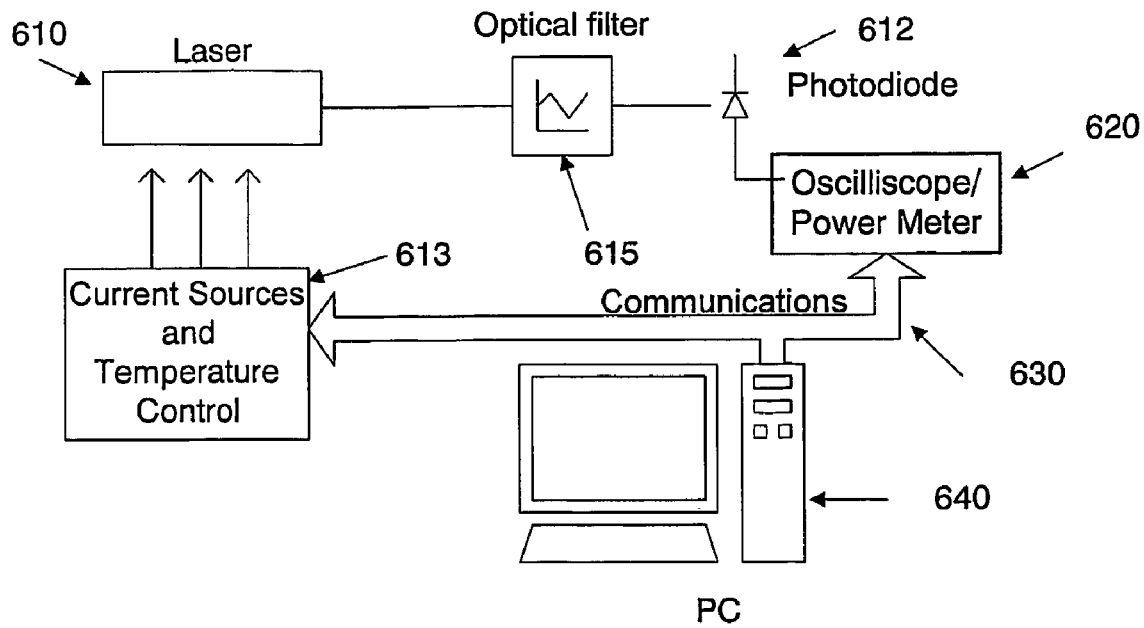
FIG. 7 shows an alternative embodiment of the components used to measure regions of instability in tunable lasers.
Figure 8:
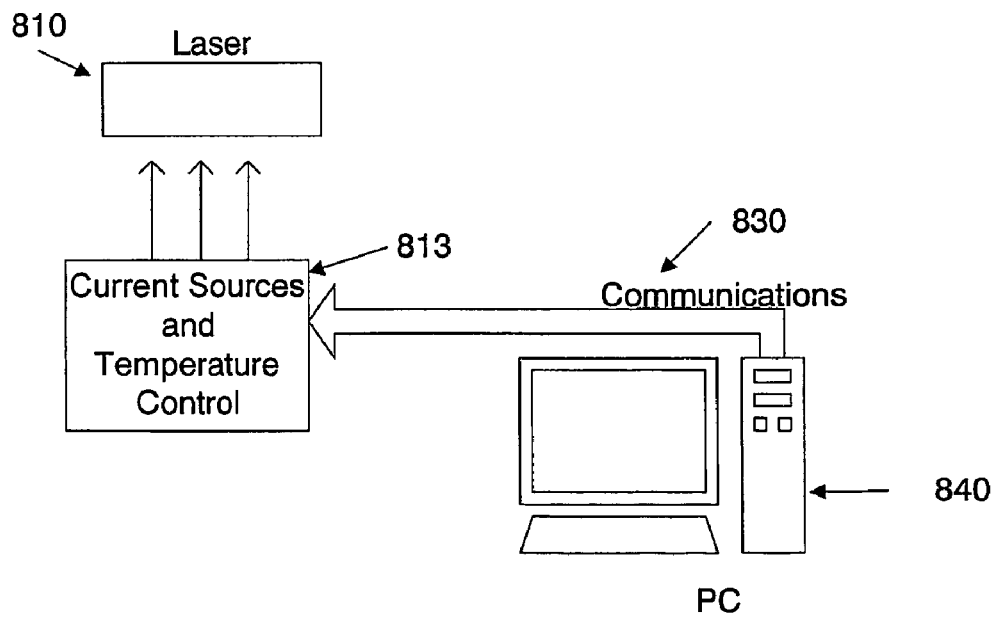
FIG. 8 shows another alternative embodiment of the components used to measure regions of instability in tunable lasers where laser section current/voltage is measured.

Referring initially to FIGS. 6-8 inclusive there is illustrated typical hardware embodiments for carrying out the present invention, the operation of which will be discussed in more detail later in the specification.

The method of the present invention provides a technique to enable the formation of a hysteresis plane, where each value of the hysteresis plane is set to have a value of either a 1 or 0. According to the method of the present invention, where the value is 1, hysteresis exists in the laser, and where the value is 0, hysteresis does not exist in the laser. Once the hysteresis plane has been formed, it is possible to control the operation of a laser so that it does not operate in its regions of instability.

The methodology of the present invention will now be described with reference to a three section DBR device. However it will be appreciated that this is exemplary of the type of device that may be used with the method of the present invention, and a number of other devices could be used without departing from the spirit of the invention.

The method of the present invention involves the creation of a power plane from the laser device in a specific manner which enables the detection of hysteresis in the device. A subsequent processing of this information may be utilised to convert this data into a hysteresis plane.

According to the method of the present invention, a series of power measurements are performed while the laser control currents are varied in a specific way, in order to create a power plane. Each axis of the power plane is one of the control currents 513 of the laser, with the first control current 20 typically being plotted on the x-axis, and the second control current 25 typically being plotted on the y-axis. Typically, the first control current 20 is injected into the Bragg section 2 of the laser, while the second control current 25 is injected into the phase section 4 of the laser. However it will be appreciated that other configurations could also be used.

Once the measured data has been plotted in the form of a measurement plane, this data it can be processed to obtain a Hysteresis plane.

Figure 1:
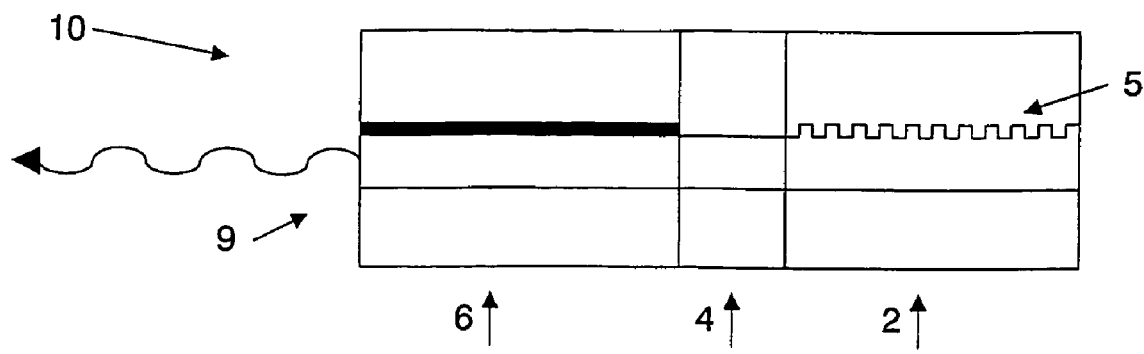
FIG. 1 shows a schematic of a Distributed Bragg Reflector Laser diode.
Figure 2:
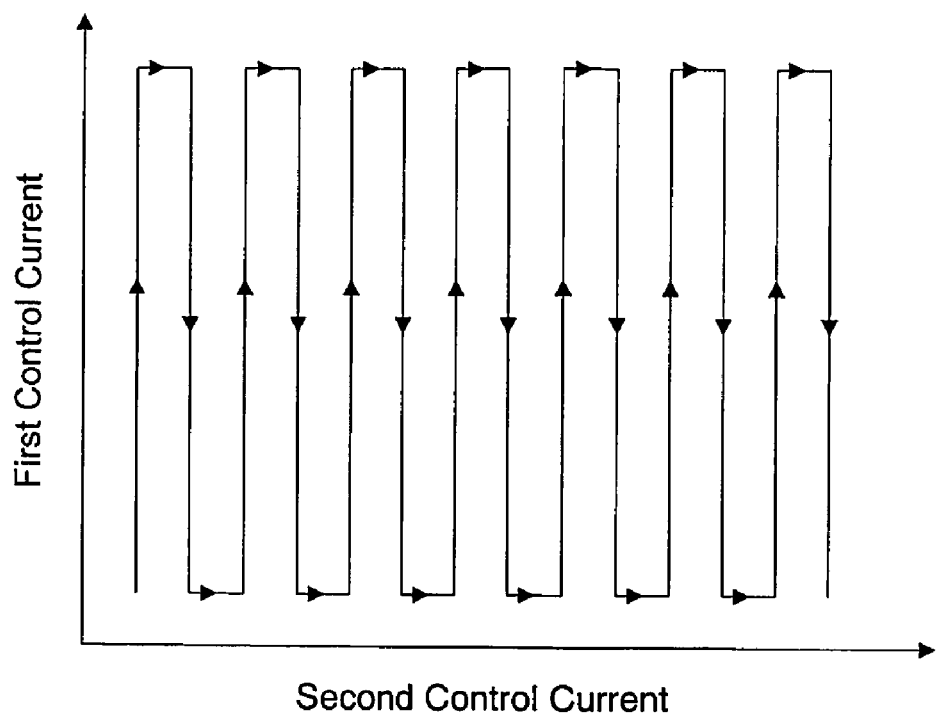
FIG. 2 shows how measurement plane of the present invention is obtained.
Figure 3:
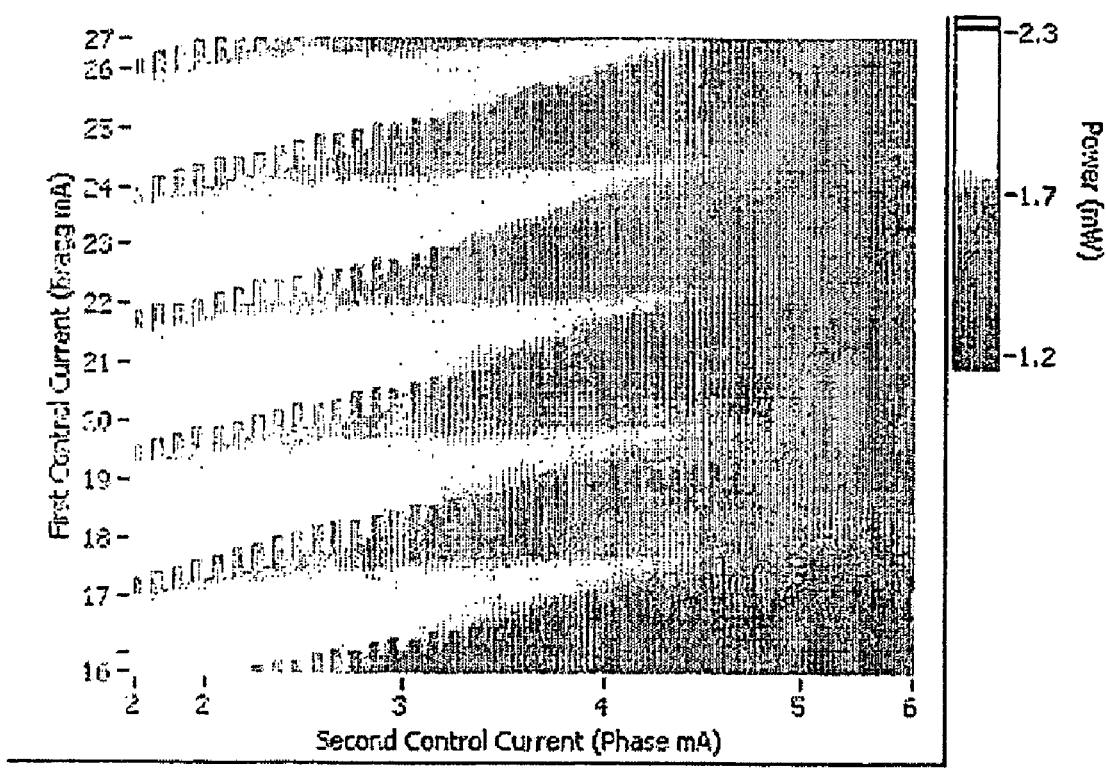
FIG. 3 is an example of a measurement where the hysteresis is interleaved.

FIG. 2 shows a first embodiment of how the measurement plane of the present invention may be obtained. Firstly, a first set of measurement values for the output of the laser diode is obtained by increasing the first control current 20 through a range of values in a positive direction. Once these measurement values have been obtained, the second control current 25 should be incremented by a step. Subsequently, a second set of measurement values for the output of the laser diode should be obtained. This is achieved by decreasing the first control current 20 through a range of values in a negative direction. These steps may be repeated until a sufficient range of the second control current 25 has been used. Typical ranges of currents used here would be the range of current required to achieve the desired tuning range of the device for example on a typical DBR type laser the current ranges would be 5 mA for the Phase section and 50 mA for the Bragg section.

By measuring the plane in this way it is possible to determine where the first control current 20 exhibits the main influence of hysteresis. A plane may be obtained where the output power of the laser is different depending on the previous current in the laser, such as that shown in FIG. 3. The colour of the graph denotes the output power in this case. As can be seen from FIG. 3, the variations in output due to hysteresis are interleaved. This is because the first control current 20 is increasing, then decreasing etc.

Once the measured data has been plotted in the form of a measurement plane, this data can be processed to obtain a Hysteresis plane. This involves passing an operator to detect the hysteresis. Examples of suitable operators are a Laplacian:

$$\begin{bmatrix} 1 & 1 & 1 \\ 1 & -8 & 1 \\ 1 & 1 & 1 \end{bmatrix} \text{ or } \begin{bmatrix} 1 & -2 & 1 \end{bmatrix}$$

or any second order differential operator or any operator that does a similar operation.

Figure 4:
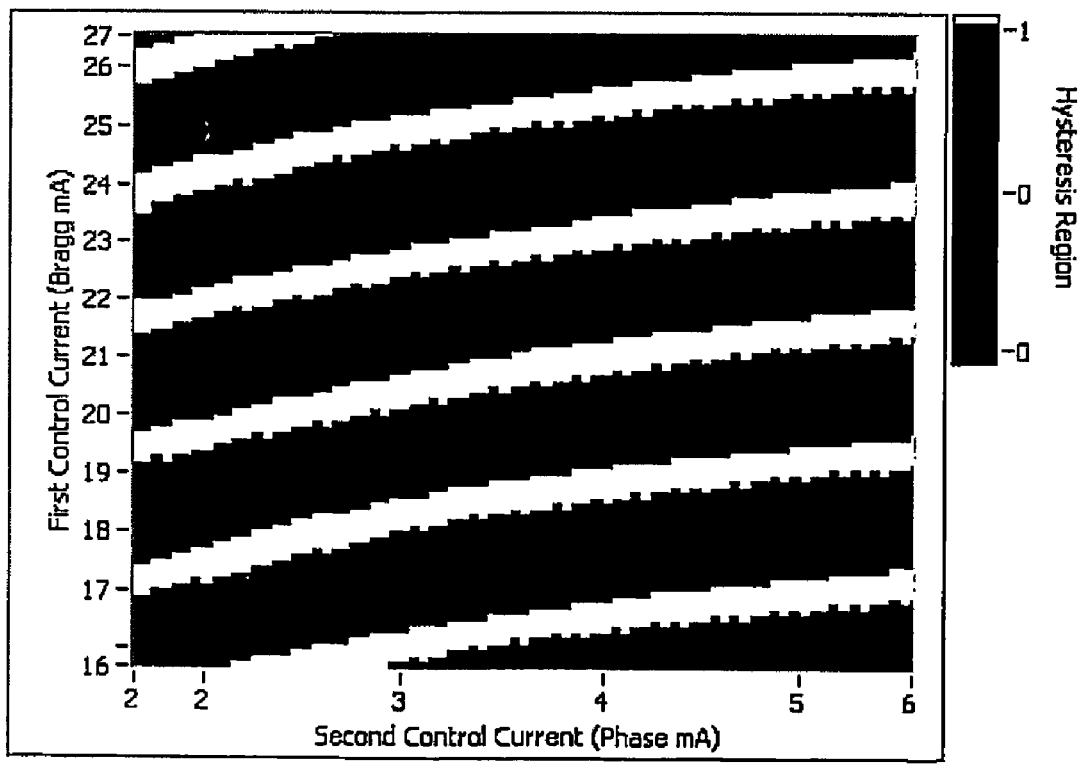
FIG. 4 is an example of the hysteresis regions of a DBR laser diode.

This, it will be appreciated, has the effect of producing a large value where hysteresis exists and a small value where hysteresis does not exist. This means that in the result a simple threshold value can be used to detect the hysteresis i.e. where the value is greater than the threshold hysteresis is said to exist, and where the value is less than the threshold hysteresis does not exist. FIG. 4 shows an example of the hysteresis regions of a typical DBR laser diode.

In some cases cavity mode jumps or other effects can cause discontinuities in the laser, which are also detected by the above method. This is advantageous as detection of these is required for calibration of the device in any case. If this is not required, a simple combination erosion and dilation operations removes these effects and the hysteresis region is all that will remain.

FIG. 6 illustrates a control system having typical components used to perform the measurement of regions of instability in tunable lasers. The components comprise a tunable laser 510 connected to a photodiode 512, and an optical fibre 514. The photodiode 512 is connected to an oscilloscope/power meter 520 which is in communication with a computer apparatus 540 and a standard current source control 513. It will be appreciated by those skilled in the art that the current source control 513 can be controlled by standard current source equipment connected to a PC or some other such controller. Similarly the response of the photodiode can be connected to a voltage meter and in turn connected to a PC or some other such controller.

Similarly FIG. 7 illustrates the control system of FIG. 6 with an optical filter 615 connected between the laser 610 and the photodiode 612.

A further embodiment illustrated in FIG. 8 illustrates a simpler construction in which a computer apparatus 840 is connected a current source and temperature control 813 over a communications link 830 which in turn is connected to a laser 810.

Figure 5:
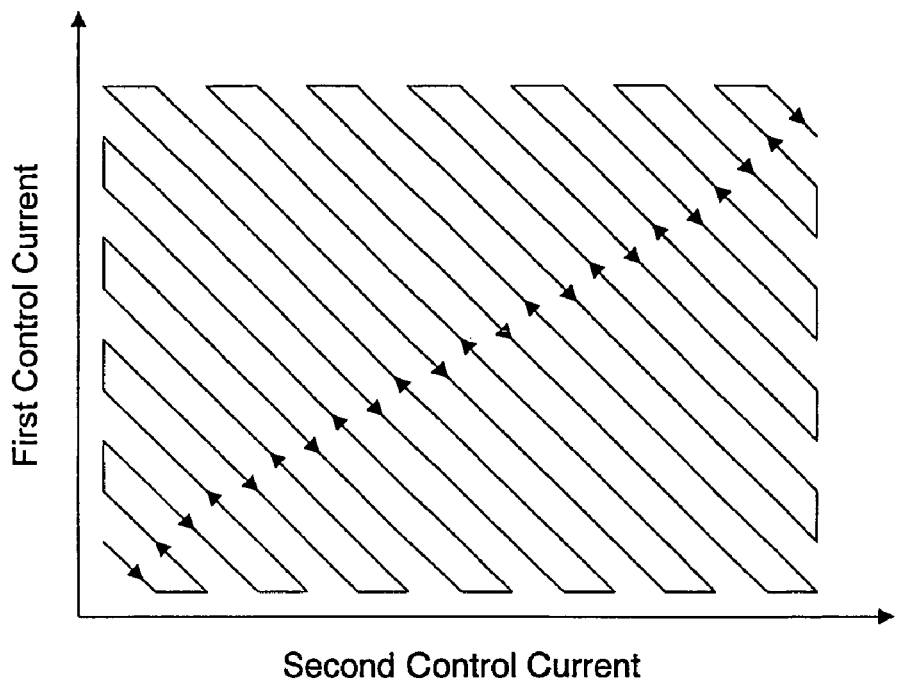
FIG. 5 shows an alternative method to obtain a measurement plane.

It will further be appreciated the present invention is not intended to be limited those embodiments described above, and that there are a number of alternative embodiments that could be used without departing from the spirit of the invention. For example, there are a number of different methods which could be used to obtain a measurement plane for the present invention. FIG. 5 shows an alternative method to FIG. 2 that could be used to obtain a measurement plane. This method has the advantage of keeping the total current in the laser as constant as possible. If the two current ranges are equal on each axis and the resolution the data is sampled at is equal the total current into the device changes at one order of magnitude less that the method shown in FIG. 2. As the current into the device is I1+I2, the total current changes once per diagonal line shown in FIG. 5.

Similarly, FIG. 7 shows an alternative set of components which could also be used to measure regions of instability in tunable lasers. This method is similar to that of FIG. 6, except the optical filter 615 is used to convert wavelength changes into optical power changes. As the regions of instability also exhibit wavelength discontinuities as well as power discontinuities while tuning the device, this is an alternative quantity to observe. This method is very useful to detect regions of instability where optical power changes may be small, but which can be easily detected by changes in optical wavelength. Examples of such filters which could be used to implement this method are, fused couplers, Fabry Perot etalons, interferometers, all of which are well known in the art, for example Michelson and Mach Zendler.

The present invention enables a required measurement plane for the detection of regions of instability in tunable lasers to be obtained in a fast and efficient manner.

A further advantage of the present invention over the prior art methods is that as the overall current changes in the laser are continuous, the technique according to the present invention keep the laser temperature more stable, as no large changes in current are required between measurements.

Another advantage of the present invention is that any parameter such as gain section voltage, SMSR, linewidth, tuning section voltage can be measured to detect the regions of instability in the laser in the same method described. If gain section voltage is used this has the advantage of not requiring any optical measurements and simplifies the measurement set-up as shown in FIG. 8.

By the use of post processing of the data in order to obtain the hysteresis from the measured data set, the method of the present invention is more tolerant to the noise of the laser over prior art methods.

The embodiments in the invention described with reference to the drawings comprise a computer apparatus and/or processes performed in an electronic device. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal that may be transmitted via an electrical or an optical cable or by radio or other means.

The invention is not limited to the embodiments hereinbefore described but may be varied in both construction and detail.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method of obtaining a measurement plane from a multi-section tunable laser diode, the method comprising:
    (a) obtaining a first set of measurement values for an output of the laser diode by increasing a first current/voltage through a range of values in a positive direction;
    (b) increasing a second control current/voltage by a step;
    (c) obtaining a second set of measurement values for the output of the laser diode by decreasing the first control current/voltage through a range of values in a negative direction;
    (d) increasing a second control current/voltage by a step;
    (e) repeating steps (a)-(d) until a sufficient range of the second control current/voltage has been used; and
    (f) identifying, in a resultant data set, regions of hysteresis.

2. A computer readable medium having stored therein instructions for causing a processor to execute the method of claim 1.

3. The method of claim 1 wherein identifying in the resultant data set the regions of hysteresis comprises applying a Laplacian operator to the resultant data set, wherein the regions of hysteresis are those regions where a value obtained by applying the Laplacian operator to data at a specified second control voltage/current is above a threshold value.

4. The method of claim 1 wherein the first and second set of measurement values are obtained by transmitting the output of the laser diode to a photo diode, whereby an output of the photo diode provides the first and second measurement values.

5. The method of claim 1 wherein the first and second set of measurement values are obtained by transmitting the output of the laser to a photo diode via an optical filter, whereby an output of the photo diode provides the measurement values.

6. The method of claim 1 wherein the first and second set of measurement values are obtained by measuring the voltage on a section of the laser where current is used to control the laser output.

7. The method of claim 1 wherein the first and second set of measurement values are obtained by measuring the current on a section of the laser where voltage is used to control the laser output.

8. The method of claim 1 wherein the first and second set of measurement values are obtained by transmitting the output of the laser to a system or instrument that can measure either linewidth or Side Mode Suppression Ratio (SMSR) of the laser.

9. The method of claim 1 wherein the regions of hysteresis are determined, at least in part, using an erosion operator on the resultant data set.

10. The method of claim 1 wherein the value of the increment of the first and second control currents is such that any changes in any single control current between measurements are below a predetermined threshold, and wherein the predetermined threshold is selected so as to substantially minimize a temperature effect contribution to the output of the laser.

11. The method as claimed in claim 1 wherein the range of values measured for the first current/voltage or the second current/voltage is non-linear.

12. A method of obtaining a measurement plane from a multi-section tunable laser, the method comprising:
(a) obtaining a first set of measurement values for the output of the laser diode by increasing a first control current through a range of values in a positive direction and decreasing a second control current in a negative direction at the same time;
(b) increasing one of the first or second control currents by a step;
(c) obtaining a second set of measurement values for the output of the laser diode by increasing the second control current through a range of values in a positive direction and decreasing a first control current in a negative direction at the same time; and
(d) repeating steps (a)-(c) until a sufficient range of the first and the second control current has been used, wherein total control currents to the laser are changing at a continuous rate.

13. A computer readable medium having stored therein instructions for causing a processor to execute the method of claim 12.

14. A control system for obtaining a measurement plane from a multi-section tunable laser diode, the control system comprising:
means for obtaining a first set of measurement values for an output of the laser diode by increasing a first current through a range of values in a positive direction;
means for increasing a second control current by a step after obtaining the first set of measurement values;
means for obtaining a second set of measurement values for the output of the laser diode by decreasing the first control current through a range of values in a negative direction;
means for increasing the second control current by a step after obtaining the second set of measurement values;
means for operating the foregoing means elements to repeatedly obtain first and second measurement values and to increase the second control current by a step until a sufficient range of the second control current has been used; and
means for identifying, in a resultant data set, regions of hysteresis.

15. The control system of claim 14 wherein the means for identifying in the resultant data set regions of hysteresis comprises means for applying a Laplacian operator to the resultant data set, wherein the regions of hysteresis are those regions where a value obtained by applying the Laplacian operator to data at a specified current is above a predetermined threshold.

16. The control system of claim 14 wherein the first and second set of measurement values are obtained by transmitting the output of the laser diode to a photo diode, whereby an output of the photo diode provides the first and second measurement values.

17. The control system of claim 14 wherein the first and second set of measurement values are obtained by transmitting the output of the laser to a photo diode via an optical filter, whereby an output of the photo diode provides the measurement values.

18. The control system of claim 14 wherein the regions of hysteresis are determined, at least in part, using an erosion operator on the resultant data set.

19. The control system of claim 17 wherein the value of the increment of the first and second control currents is such that any changes in any single control current between measurements are below a predetermined threshold, and wherein the predetermined threshold is selected so as to substantially minimize a temperature effect contribution to the output of the laser.

20. A control system for obtaining a measurement plane from a multi-section tunable laser diode, the control system comprising:
means for obtaining a first set of measurement values for an output of the laser diode by increasing a first control current through a range of values in a positive direction and decreasing a second control current in a negative direction at the same time;
means for increasing one of the first or second control current by a step after obtaining the first set of measurements;
means for obtaining a second set of measurement values for the output of the laser diode by increasing the second control current through a range of values in a positive direction and decreasing a first control current in a negative direction at the same time; and
means for operating the foregoing means elements to repeatedly obtain first and second sets of measurements and to increase one of the first or second control current by a step until a sufficient range of the first or second control current has been used, where total control currents to the laser are changing at a continuous rate.

21. A control system for obtaining a measurement plane from a multi-section tunable laser diode, the control system comprising:
a current source control for obtaining a first set of measurement values for an output of the laser diode by increasing a first control current through a range of values in a positive direction;

a meter for obtaining a second set of measurement values for the output of the laser diode by decreasing the first control current through a range of values in a negative direction;

an increment function for increasing a second control current by a step after obtaining the first set of measurement values but before obtaining the second set of measurement values, and for incrementing the second control current by a step after obtaining the second set of measurement values;

a repetition function for repeatedly obtaining first and second measurement values and incrementing the second control current over a predetermining range of possible values for the second control current; and a computing apparatus for identifying regions of hysteresis in a resultant data set.

22. A control system for obtaining a measurement plane from a multi-section tunable laser diode is provided, the control system comprising:

a current source control for obtaining a first set of measurement values for an output of the laser diode by increasing a first control current through a range of values in a positive direction and decreasing a second control current in a negative direction at the same time;

a meter for obtaining a second set of measurement values for the output of the laser diode by increasing the second control current through a range of values in a positive direction and decreasing a first control current in a negative direction at the same time;

a increment control for incrementing either the first control current or the second control current by a step after obtaining the first set of measurement values but before obtaining the second set of measurement values; and a repetition control for repeatedly obtaining first and second sets of measurement values, and incrementing the first or second control current, over a predetermined range of the first and second control currents, wherein the total control currents to the laser are changing at a continuous rate.

* * * * *